United States Patent [19]

Conrad

[11] Patent Number: 4,764,394

[45] Date of Patent: Aug. 16, 1988

[54] METHOD AND APPARATUS FOR PLASMA SOURCE ION IMPLANTATION

[75] Inventor: John R. Conrad, Madison, Wis.

[73] Assignee: Wisconsin Alumni Research Foundation, Madison, Wis.

[21] Appl. No.: 5,457

[22] Filed: Jan. 20, 1987

[51] Int. Cl.⁴ .............................................. B05D 3/06
[52] U.S. Cl. ....................................... 427/38; 427/39
[58] Field of Search ..................................... 427/38, 39

[56] References Cited

U.S. PATENT DOCUMENTS

| | | |
|---|---|---|
| 3,117,022 | 1/1964 | Bronson et al. |
| 3,806,380 | 4/1974 | Kitada et al. ........................ 148/159 |
| 3,832,219 | 8/1974 | Nelson et al. |
| 3,900,636 | 8/1975 | Curry et al. ........................... 427/38 |
| 3,915,757 | 10/1975 | Engel ...................................... 148/6 |
| 4,039,416 | 8/1977 | White ............................... 204/192 N |
| 4,107,350 | 8/1978 | Berg et al. ............................. 427/38 |
| 4,170,662 | 10/1979 | Weiss et al. ........................... 427/38 |
| 4,252,837 | 2/1981 | Auton .................................... 427/39 |
| 4,342,631 | 8/1982 | White et al. ..................... 204/192 N |
| 4,346,123 | 8/1982 | Kaufmann ............................. 427/38 |
| 4,468,309 | 8/1984 | White ............................... 204/192 N |
| 4,471,003 | 9/1984 | Cann ..................................... 427/38 |
| 4,486,247 | 12/1984 | Ecer et al. ........................... 148/31.5 |
| 4,490,190 | 12/1984 | Speri ................................ 204/192.31 |
| 4,500,563 | 2/1985 | Ellenberger et al. ................. 427/38 |
| 4,568,563 | 2/1986 | Jackson et al. ....................... 427/40 |
| 4,684,535 | 8/1987 | Heinecke et al. ..................... 427/38 |

OTHER PUBLICATIONS

S. Picraux et al., "Ion Implantation of Surfaces," *Scientific American*, vol. 252, No. 3, 1985, pp. 102–113.
U.S. Department of Energy Report entitled "The Fusion Connection: . . . ", Oct. 1985, Plasma Coating, pp. 6–7.
V. M. Cassidy, "Ion Implantation Process Toughens Metalworking Tools," *Modern Metals*, Sep. 1984, pp. 65–67.
P. Sioshansi, "Ion Beam Modification of Materials for Industry," *Thin Solid Film*, vol. 18, 1984, pp. 61–71.
D. M. Hulet et al., "Ion Nitriding and Ion Implantation: A Comparison," *Metal Progress*, Aug. 1985, pp. 18–21.
M. Renier et al, "A New Low-Energy Ion Implanter for Bombarment of Cylindrical Surfaces", *Vacuum*, vol. 35, No. 12, 1985, pp. 577–578.
N. Basta, "Ion–Beam Implantation", *High Technology*, Feb. 1985.

Primary Examiner—Norman Morgenstern
Assistant Examiner—Marianne L. Padgett
Attorney, Agent, or Firm—Isaksen, Lathrop, Esch, Hart & Clark

[57] ABSTRACT

Ion implantation into surfaces of three-dimensional targets is achieved by forming an ionized plasma about the target within an enclosing chamber and applying a pulse of high voltage between the target and the conductive walls of the chamber. Ions from the plasma are driven into the target object surfaces from all sides simultaneously without the need for manipulation of the target object. Repetitive pulses of high voltage, typically 20 kilovolts or higher, causes the ions to be driven deeply into the target. The plasma may be formed of a neutral gas introduced into the evacuated chamber and ionized therein with ionizing radiation so that a constant source of plasma is provided which surrounds the target object during the implantation process. Significant increases in the surface hardness and wear characteristics of various materials are obtained with ion implantation in this manner.

37 Claims, 4 Drawing Sheets

METHOD AND APPARATUS FOR PLASMA SOURCE ION IMPLANTATION

This invention was made with government support under NSF Grant No. ECS-8314488 awarded by the National Science Foundation and Grant No. DE-AC02-78ET51015 awarded by the Department of Energy. The United States government has certain rights in this invention.

FIELD OF THE INVENTION

This invention pertains generally to the field of surface treatment and particularly to surface treatment by ion implantation techniques.

BACKGROUND OF THE INVENTION

Ion implantation offers great commercial promise for the improvement of the surface characteristics of a variety of materials, including metals, ceramics and plastics. In the conventional ion implantation process, ions are formed into a beam and accelerated to high energy before being directed into the surface of a solid target. thermodynamic constraints of more conventional techniques, ion implantation allows new materials to be produced with new surface properties. In particular, implantation can be used to improve greatly the friction, wear and corrosion resistance properties of the surfaces of metals. For example, implantation of nitrogen ions in a titanium alloy artificial hip joint has increased the joint lifetime by a factor of 400 or more. The properties of ceramic components and ceramic cutting tools can also be improved by ion implantation. For a general discussion of the techniques and potential advantages of ion implantation, see generally S. Picraux, et al., "Ion Implantation of Surfaces", *Scientific American*, Vol. 252, No. 3, pp. 102-113, 1985; D. M. Hulett, et al., "Ion Nitriding and Ion Implantation: A Comparison," *Metal Progress*, August 1985, pp. 18-21; V. M. Cassidy, "Ion Implantation Process Toughens Metalworking Tools," *Modern Metals*, September 1984, pp. 65-67.

While commercially viable applications of conventional ion implantation techniques have been demonstrated, the relatively high cost of the process has limited its use thus far to high unit cost items having very special applications. A significant factor in the substantial production costs of conventional ion implantation is that significant and time-consuming manipulation of the ion beam and the target is required to obtain implantation over the entire surface of a three-dimensional target. In conventional ion implantation, the ions are extracted from a plasma source and focused into a beam which is accelerated to the desired energy and then rastered across one face of the target to uniformly implant the surface of that face. Because of the line of sight nature of this ion implantation technique, a manipulator platform or stage is required which can support the target for rotation in the beam so that all sides of the target can be implanted. The need to manipulate a three-dimensional target to allow all sides of the target to be implanted adds cost and complexity, constrains the maximum size of the target which can be implanted, and increases the total time required to obtain satisfactory implantation of all target surfaces for relatively large targets. Because the ions travel to the target in a largely unidirectional beam, it is often necessary to mask targets having convex surfaces so that ions are allowed to strike the target only at angles substantially normal to the target surface. Normal incidence of ions to the surface is preferred since as the difference in the angle of incidence from the normal increases, sputtering increases and the net retained dose in the target decreases.

SUMMARY OF THE INVENTION

The present invention provides significantly improved production efficiencies in ion implantation of three-dimensional materials by achieving implantation from all sides of the target simultaneously. Consequently, the production efficiency for implantation of three-dimensional objects is greatly increased over conventional ion implantation techniques. Since the target need not be manipulated, complicated target manipulation apparatus is not required.

In accordance with the present invention, which may be denoted plasma source ion implantation, the target to be implanted is surrounded by the plasma source within an evacuated chamber. A high negative potential pulse is then applied to the target relative to the walls of the chamber to accelerate ions from the plasma across the plasma sheath toward the target in directions substantially normal to the surfaces of the target at the points where the ions impinge upon the surface. The high voltage pulse, e.g., typically 20 kilovolts (kV) or higher, causes the ions to be driven deeply into the target object, typically causing ions to be distributed into the crystal lattice of the target to form a modified material layer over all exposed surfaces of the target object. Multiple pulses may be applied between the target and the chamber walls in rapid succession to perform multiple implantations until a desired concentration of implanted ions within the target object is achieved.

Preferably, the ion source plasma surrounding the target object is formed by introducing the ion source material in a gas or vapor form into the highly evacuated space within the confining chamber. The gaseous material may then be ionized by directing ionizing radiation, such as a diffuse beam of electrons, through the source gas in a conventional manner. Consequently, a plasma of ions is formed which completely surrounds the target object itself so that ions may be implanted into the target from all sides, if desired. Multiple targets, properly spaced within the plasma, may be implanted simultaneously in accordance with the invention.

Utilizing the ion implantation process and apparatus of the present invention, ion implantations may be performed on complex, three-dimensional objects formed of a great variety of materials, including pure metals, alloys, semi-conductors, ceramics, and organic polymers. Significant increases in surface hardness are obtained with ion implantation of a variety of source materials, including gases such as nitrogen, into metal and ceramic surfaces. Ion implantation of organic plastic materials can produce desirable surface characteristic modifications including a change in the optical properties and the electrical conductivity of the polymer. Ion implantation is also found to be particularly beneficial when used in conjunction with conventional heat treatment hardening techniques. Metal objects which have been both ion implanted in accordance with the present invention and heat treated are found to exhibit significantly greater hardness and resistance to wear than objects which are only heat treated or ion implanted, but not both.

DESCRIPTION OF THE PREFERRED EMBODIMENT

Figure 1:
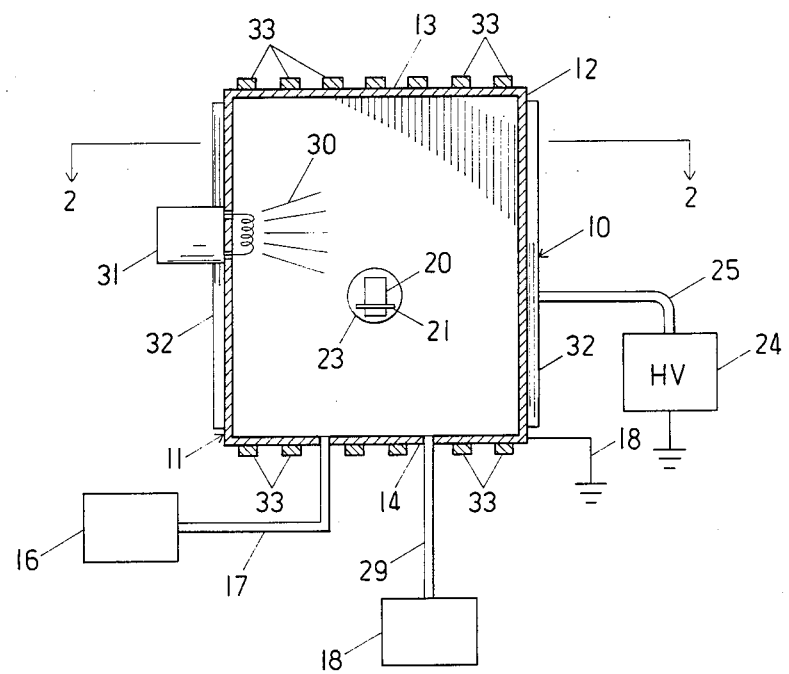
FIG. 1 is a simplified cross-sectional view through an ion implantation chamber with associated apparatus in accordance with the present invention.

With reference to the drawings, an ion implantation apparatus in accordance with the present invention is shown generally at 10 in partial cross-section in FIG. 1. The apparatus 10 includes an enclosing chamber 11 having conductive walls, e.g., of stainless steel or aluminum, which may be formed, as shown, with an outer cylindrical wall 12, a flat top wall 13 and a flat bottom wall 14. A vacuum pump 16 is connected by an exhaust line 17 to the interior of the chamber and operates to evacuate the chamber to a very low base pressure vacuum level (typically on the order of $10^{-6}$ Torr). As explained further below, the operating pressure within the chamber 11 is preferably on the order of $10^{-4}$ Torr. All of the walls 12, 13 and 14 making up the chamber 11 are electrically connected together and connected by a line 18 to ground.

The target object illustratively shown at 20 as a three-dimensional block is mounted substantially in the middle of the interior of the chamber 11, spaced away from all of the walls of the chamber, on a stage 21 at the end of a conductive support arm 22. Of course, the target 20 may assume a variety of shapes, including shapes having indentations and cavities. The target may be placed on and removed from the stage 21 through a door (not shown) formed in a conventional fashion in the enclosure wall 12 which, when closed, seals airtight the wall and is also electrically connected to the walls to be at the same potential as the walls. It is a particular advantage of the present invention that a variety of complex shapes can be ion implanted without the need for a complex manipulation of either an ion beam or the target as required in conventional line of sight ion implantation, thereby eliminating the need for the conventional ion accelerator stage, raster scan apparatus and target manipulator. The arm 22 holds the target 20 in a fixed position and is electrically in contact with it, as by a conductive clamp (not shown) on the stage 21. The arm may be covered with electrical insulation, if desired, or even shielded so that ions are not attracted to the arm. In addition, the support arm 22 may also be formed so that a coolant fluid is circulated through it to allow thermodynamic cooling of the target 20 during the ion implantation process to maintain the target in substantial thermal equilibrium. Cooling of the target during implantation is desirable to minimize the thermal diffusion of ions away from the target surface. The conductive support arm 22 is electrically isolated, by an insulator 23, from the conductive wall 12 of the chamber through which it passes, and the insulator 23 is also formed to provide an air-tight seal to the wall 12 of the chamber. A high voltage, pulse power supply 24 is used to provide the high voltage through a supply line 25 to the conductive support arm 22. The supply 24 provides repetitive pulses of high voltage, e.g., in the 20 kV to 100 kV range, of a duration selected as described below. For example, the high voltage supply may be of the pulse line-pulse transformer type providing pulse lengths in the range of a few microseconds, or the supply may be chosen from various types of high voltage tube modulated pulsers capable of providing relatively long pulse lengths in the millisecond range or longer.

Figure 2:
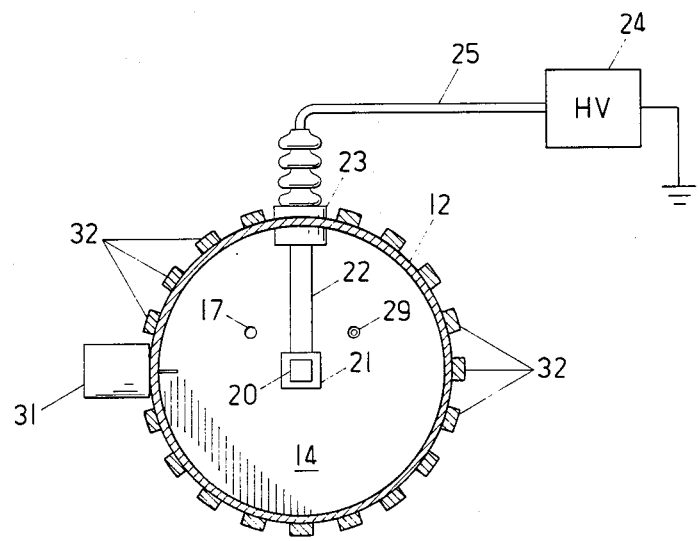
FIG. 2 is a cross-section through the ion implantation chamber of FIG. 1 taken generally along the lines 2—2 of FIG. 1.

In accordance with this invention, an ionized plasma is developed which surrounds the target 20 within the chamber 11 so that ions may be accelerated into the target from all sides. To develop the surrounding plasma, where a gas is to be used as the material to be implanted, a gas source 28 is connected by a line 29 to leak the gas at a low, controlled rate into the chamber 11 as it is being evacuated by the vacuum pump 16. Prior to ionization, there thus will be a low pressure atmosphere of the gas from the gas source 28 within the chamber 11 mixed with very low levels of other impurity gases such as oxygen, etc. For purposes of illustration, the following description will assume that a source of nitrogen gas is provided from the gas source 28, although it will be apparent that many other sources of ionizing ambient may be provided using well known techniques, including sources provided by the vaporization of liquids and solids to form the ambient gas. The neutral gas within the chamber may be ionized in various ways. One method illustrated in FIGS. 1 and 2 is the injection into the chamber of a diffuse beam of electrons 30 from a heated filament electron source 31. The beam of electrons from the source 31 spreads through the interior of the chamber 11, colliding with the neutral gas to form ions. To maximize the collisions between the electrons ejected from the source 31 and the ambient gas, magnet bars 32 are distributed about the outer periphery of the cylindrical side wall 12 of the chamber and magnetic pellets 33 are distributed over the top wall 13 and bottom wall 14. Adjacent magnet bars 32 are oppositely poled—i.e., alternating north to south to north, etc.—so that magnetic lines of force run between adjacent magnet bars within the interior of the chamber. Similarly, adjacent magnetic pellets 33 on the top and bottom walls of the chamber are oppositely poled so that magnetic lines of force run into the chamber between these pellets. The magnetic field thus formed around the interior of the chamber adjacent to the walls of the chamber causes electrons from the electron source to turn around as they approach the wall and move back into the interior of the chamber, where they may collide with gas atoms or molecules to ionize the gas.

Utilizing a multi-dipole filament discharge electron source 31 at an operating pressure in the range of approximately $10^{-5}$ to $10^{-3}$ Torr, satisfactory plasmas are formed having a density of $10^6$ to $10^{11}$ ions per cubic centimeter with an electron temperature of a few electron volts and an ion temperature of less than one electron volt. Of course, it is readily apparent to those of ordinary skill that various other sources of ionizing radiation (e.g., radio frequency electromagnetic radiation) may be utilized to ionize the gas within the chamber 11 to form a plasma which surrounds the target object.

A great variety of materials can be used as the target objects 20 for ion implantation in this manner, including pure metals and alloy metals such as steel, semiconductors, ceramics, and structural organic polymers. Any of the various plasma sources well known in conventional ion implantation may be utilized as the source of the ions to be implanted, with these ions being introduced into the chamber 11 to form a plasma which substantially surrounds the target object. These include gases such as nitrogen, argon, oxygen, and hydrogen. Ion mixing can also be obtained by techniques used in conventional ion implantation—for example, by evaporating boron and/or carbon layers on a substrate such as $Al_2O_3$ followed by implantation with nitrogen ions. Examples of specific implantations carried out in accordance with the invention are described below.

Figure 3:
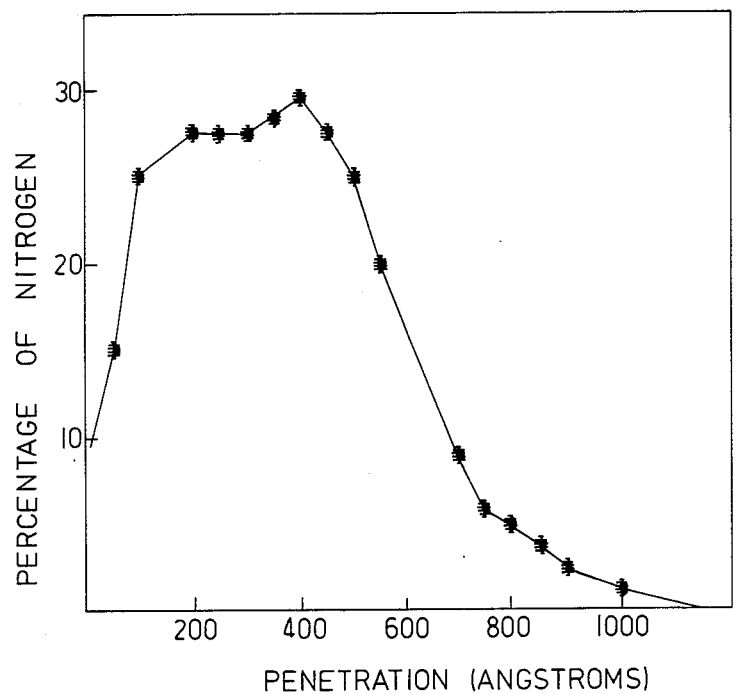
FIG. 3 is a graph showing Auger measurements of nitrogen ion concentration versus depth for a silicon target implanted with 25 keV nitrogen ions.

A target formed of a wafer of single crystal silicon of high purity was used as the target 20 mounted within the chamber 11, so that implantation would occur on one of the flat surfaces of the silicon. Nitrogen was used as the gas source introduced into the chamber 11, utilizing a multi-dipole filament discharge plasma source operating at a neutral pressure of $2 \times 10^{-4}$ Torr, resulting in an ion density of approximately $2 \times 10^8$ per cubic centimeter. Pulses of voltage were provided from the high voltage supply 24 have a peak pulse voltage between the walls of the chamber 11 and the target of approximately $-25$ kV. The pulse duration was approximately 1 to 4 microseconds at a repetition rate of 60 Hz. The total implantation time during which pulses were applied to the target was 110 minutes. After implantation, the implanted surface of the silicon target substrate was examined using auger spectroscopy. The Auger measurement of nitrogen concentration versus depth from the silicon substrate surface for nitrogen ion implantations at a calculated average nitrogen ion energy at point of impact of 25 keV is shown in the graph of FIG. 3. It is seen that the percentage of nitrogen within the silicon crystal lattice increases up to a depth of approximately 400 Angstroms and gradually tails off with greater depth. Significant concentrations of nitrogen ions—in the 25 to 30 percent range—are found over a depth of approximately 100 to 500 Angstroms from the surface of the silicon. This demonstrates substantial penetration of the nitrogen ions into the silicon bulk rather than the coating of ions onto the surface. It is also noted that the concentration of nitrogen ions is less at the surface of the silicon than at depths below the surface up to 500 to 600 Angstroms. In is thus seen that substrates of semiconductors such as silicon can be implanted with a selected dopant over a large surface area in a single implantation operation with masking being used in the normal manner, if desired, to select the areas of the silicon substrate which are to be implanted.

Figure 4:
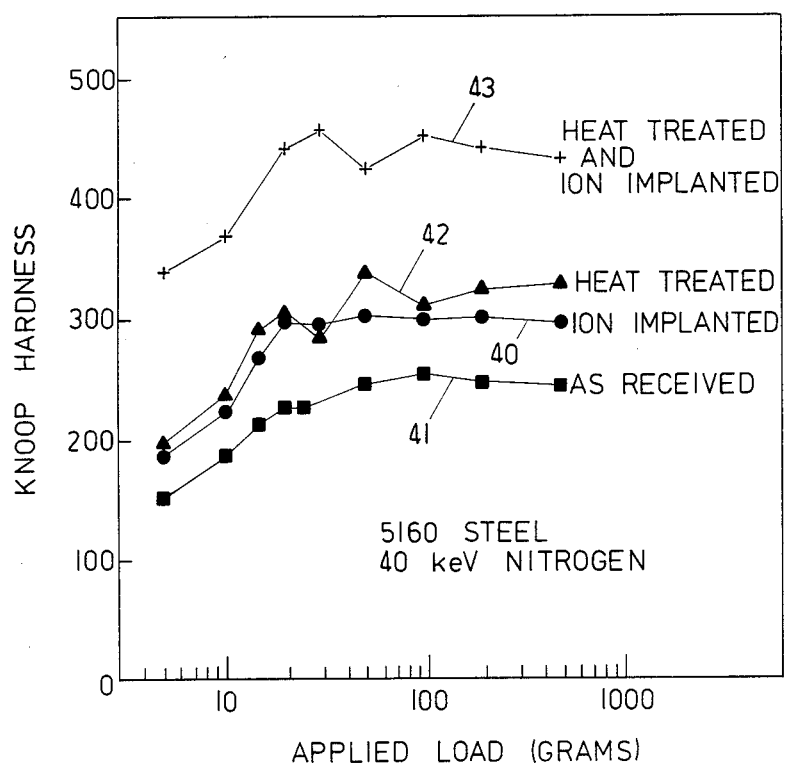
FIG. 4 is a graph showing Knoop hardness for a 5160 steel target for a sample as received, with ion implantation alone, with heat treatment alone, and with heat treatment and ion implantation.

The microhardness and tribological properties of materials may also be improved utilizing ion implantation carried out in accordance with the invention. As an example of the improvements which may be obtained in this manner, several type 5160 steel blocks were utilized as the target objects and were implanted in a nitrogen plasma utilizing a multi-dipole filament discharge plasma source at a neutral pressure of $2 \times 10^{-4}$ Torr and a resulting ion density of approximately $2 \times 10^{-8}$ per cubic centimeter. The target was pulsed repetitively to a peak voltage of $-40$ kV to provide nitrogen ions having a peak energy of 40 keV at a total ion fluence of approximately $3 \times 10^{17}$ per square centimeter of target surface area. With reference to FIG. 4, the ion implanted specimen showed an increased Knoop hardness, as represented by the graph 40, which is approximately 25 percent greater than the as received material shown by the graph 41. Heat treatment of the blocks alone showed the Knoop hardness represented by the graph 42 in FIG. 4. However, the combination of heat treatment followed by ion implantation of the blocks resulted in the Knoop hardness represented by the graph 43 of FIG. 4, a doubling of the Knoop hardness over the as received material. Block on ring wear tests (ASTM standard practice G77-83) show an improvement in the wear resistance of ion implanted and heat treated 5160 steel specimens of approximately 50% over as-received samples.

Improved wear resistance has also been obtained for precipitation hardened Invar (microhardness doubled at light loads, wear resistance improved by 250%), M2 tool steel punches, and ceramic cutting tool inserts ($Al_2O_3$ with SiC whisker crystals, more than a doubling of tool lifetime obtained). Electrical conductivity of organic polymer plastic (Kapton-H) has been modified by ion implantation.

It is a particular advantage of the plasma source ion implantation process to utilize separate voltage sources for the high voltage pulse power supply 24 and for the electron source 31 which provides the ionizing radiation since the use of the two separate sources allows the plasma density to be adjusted independently of the acceleration energy. The nature of the high voltage pulse provided from the supply 24 between the target 20 and the surrounding enclosure walls 12 is a significant process condition for two reasons. First, a relatively short duty cycle (pulse width times the repetition rate) minimizes or eliminates surface damage to the tarqet from sustained high voltage arcing. Second, as explained more fully below, the relatively short pulse width of the repetitive pulses applied in the process of this invention provides spatial uniformity and implantation depth uniformity by choosing the pulse width such that the plasma sheath which forms around the target does not expand sufficiently during the time of the applied voltage pulse to contact either the chamber enclosure walls or the sheath which surrounds adjacent targets if multiple targets are being implanted. The reasons for these criteria for the acceleration voltage pulse width can be best understood by considering the dynamics of the plasma sheath which surrounds the target or targets during plasma source ion implantation.

When a large negative potential pulse is applied to a target electrode (such as a target object 20) immersed in a plasma, a plasma sheath forms around the electrode. The plasma sheath is a region, between a quasi-charge neutral plasma and an electrode, in which charge neutrality is violated. Three time scales govern the dynamic response of the sheath. Just prior to the application of the voltage pulse, at time $t=0$, the electrode is at zero potential. As the voltage pulse is applied to the electrode and the potential of the electrode increases to the maximum negative potential, electrons are expelled from a region near the electrode. This expulsion occurs rapidly on a time scale governed by the inverse electron plasma frequency. During this initial expulsion of electrons, the much heavier ions experience negligible motion so that as the electrons are repulsed, they leave behind a region of nearly uniform ion space charge. This positive space charge region establishes a potential profile which can be described by an ion-matrix model. Later on during application of the voltage pulse, on a slower time scale governed by the inverse ion plasma frequency, ions are accelerated toward the electrode as they fall through the ion-matrix sheath. At a later time during the application of the pulse, on a much longer time scale (much greater than the inverse ion plasma frequency), the decreasing ion density inside the sheath region causes a corresponding decrease in the electron density, and consequently the sheath edge expands outwardly at approximately the plasma ion acoustic velocity. The thickness of the initial ion-matrix sheath can be calculated based on a theoretical analysis of sheath physics for various target geometries. The expansion rate of the sheath can be calculated from the standard expression for the ion acoustic velocity in a plasma.

The ion-matrix sheath thickness is determined by the plasma density, target radius of curvature, and applied implantation potential. The subsequent sheath expansion depends on the plasma electron temperature and the ion mass. For example, for implantation of nitrogen ions into a cylinder of 1 centimeter radius, at a potential of 100 kilovolts, the initial ion-matrix sheath forms at a radius of four centimeters from the central axis of the target cylinder, and the sheath expands at an ion acoustic velocity of 0.25 centimeters per microsecond. The pulse length of the plasma source ion implantation waveform should be chosen to be short enough that the expanding sheath does not contact either the vacuum chamber wall or the sheath which surrounds an adjacent target if multiple targets are being implanted. For example., if the pulse length is chosen to be 30 microseconds, the sheath will expand to an ultimate radius of 11.5 centimeters, thus requiring that the enclosure wall surrounding the target be at least that distance from the central axis of the target.

Figure 5:
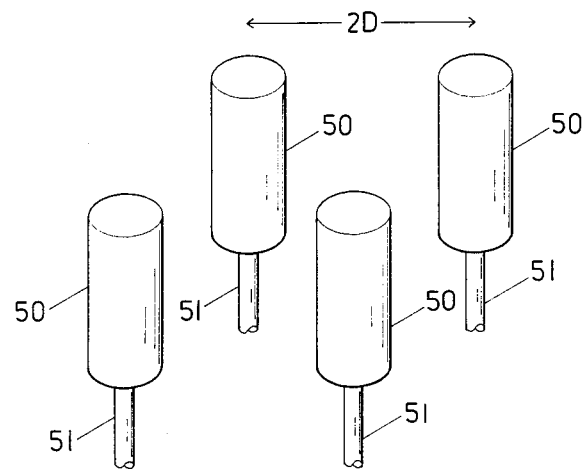
FIG. 5 is a simplified perspective view of several identical cylindrical targets mounted within the ion implantation chamber to be implanted simultaneously.
Figure 6:
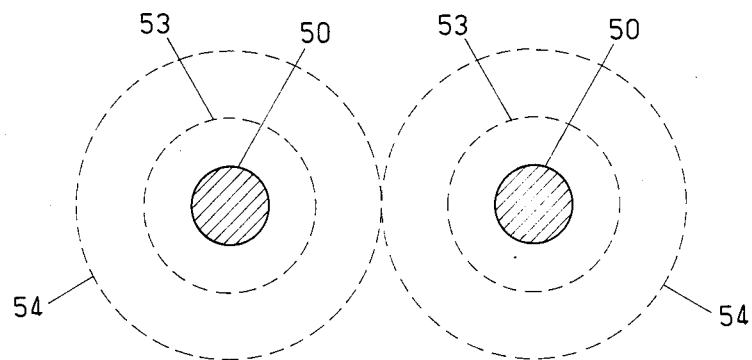
FIG. 6 is a schematic view illustrating the spacing requirements for multiple cylindrical targets in the ion implantation chamber.
Figure 7:
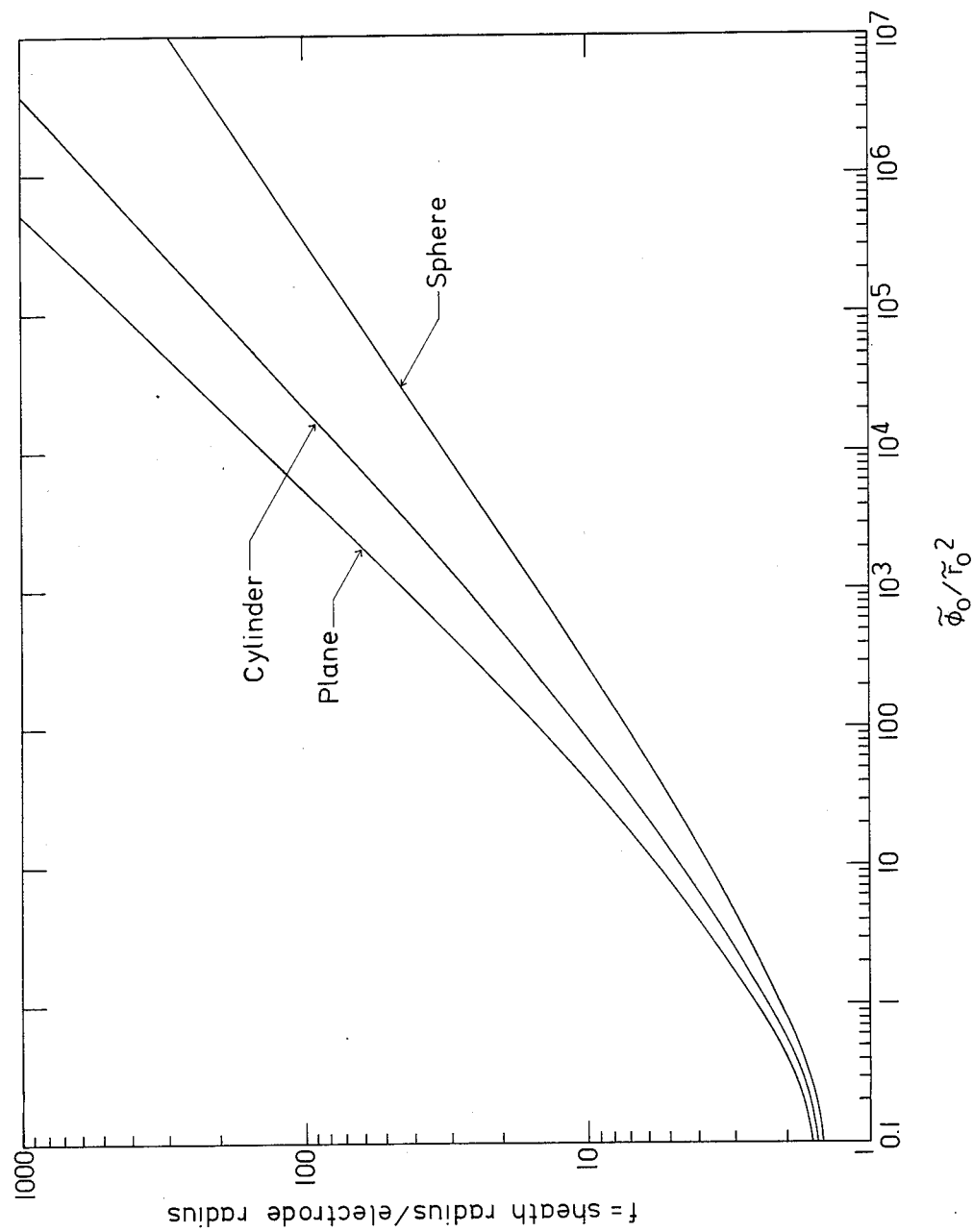
FIG. 7 are graphs showing calculated spacing requirements for planar, cylindrical and spherical targets under various implantation conditions.

For a given ion density, acceleration potential, and target radius of curvature, it is found that the ion-matrix sheath thickness is larger for a cylindrical target than for a spherical target. Thus, the cylindrical target may be considered the worst case for purposes of determining the target spacing required for multiple targets. For illustration, four cylindrical targets are shown at 50 in FIG. 5 in simplified perspective view, supported on support arms 51 which also transmit the voltage pulse to the targets. The targets 50 are equally spaced from one another in a matrix at a spacing which will be denoted 2D, as illustrated in FIG. 6. In FIG. 6, the cylindrical target 50 has a radius $r_0$, the initial ion-matrix sheath illustrated by the dashed line labeled 53 has a radius which will be denoted as $r_{S0}$, and the expanding sheath edge illustrated by the dashed line labeled 54 in FIG. 6 has a radius which will be denoted as $r_S$. Using this nomenclature, the expression for the expansion of the sheath may be written as $r_S \cong r_{S0} + C_S t$, where $r_{S0}$, the initial ion matrix sheath thickness, is calculated from an analysis of the sheath physics, $C_S$ is sheath acoustic speed, and t is pulse length. FIG. 7 illustrates graphs which allow calculation of the initial ion matrix sheath thickness $r_{S0}$ for plane, cylindrical and spherical electrodes (or targets). The graphs of FIG. 7 show the ratio of the sheath radius to the electrode (target) radius for cylindrical spherical targets as a function of the quantity $\bar{\phi}_0/\bar{r}_0^2$, a dimensionless parameter. That parameter may be expressed in terms of physical quantities as follows: $\bar{\phi}_0/\bar{r}_0^2 = \phi_0/(4\pi n e r_0^2) = 5.53 \times 10^5 (\phi_0/n_0 r_0^2)$ where $r_0$ is the target radius, $\phi_0$ is the applied potential, $n_0$ is the plasma density, and e is the electron charge.

For planar targets, the potential is translationally invariant and the electrode position $r_0$ can be set to zero, and the expression for sheath radius reduces to $\bar{r}_S = (2\bar{\phi}_0)^{\frac{1}{2}}$ where $\bar{r}_S = r_S/\lambda_D$, $\bar{\phi}_0 = e\phi_0/T_e$, $\lambda_D^2 = T_e/(4\pi n_0 e^2)$, and $T_e$ is electron temperature.

To satisfy the condition that the expanding sheath surrounding adjacent targets just merge at the end of the pulse time, $r_S$ will be equal to D, which implies that the pulse length $t = (D - r_{S0})/C_S$. The maximum pulse length for a single target can be calculated in a similar manner if it is assumed that the distance D is the distance to the walls of the chamber surrounding a single target. Of course, the distance of the outermost of multiple targets should be sufficiently distant from the chamber walls that the sheath will not reach the wall during a pulse.

The fluence F per pulse can be calculated from the following expression:

$$F = n_0(r_S^2 - r_0^2)/r_0$$

which is approximately equal to $n_0 r_S^2/r_0$ if $r_0 << r_S$, a condition that is satisfied for targets with relatively small radii.

A significant limitation on the pulse repetition rate is the amount of average power that can be absorbed by the targets so that a satisfactory thermal equilibrium is maintained by the targets. The average power $H_{avg}$ per unit area of target can be found from the expression $$H_{avg} = e\phi_0 F/T$$

where $\phi_0$ is the applied voltage, e is the electron charge, F is the fluence, and T is the time spacing between the trailing edge of one pulse and the leading edge of the next pulse.

As an example, assume it is desired to keep the average power per unit area less than five watts per square centimeter. Assume further the following typical values for the operating conditions: plasma density $n = 10^{10}$ per cubic centimeter, applied potential $\phi_0 = 100$ kV, ion acoustic velocity $C_S = 0.25$ centimeters per microsecond, and cylindrical target radius $r_0 = 1$ centimeter. The calculated Debye length $\lambda_D = 0.01$ centimeter, the normalized electrode radius $\bar{r}_0 = r_0/\lambda_D$ will thus equal 100, the normalized potential will be equal to 50,000 and the dimensionless sheath scaling parameter $\bar{\phi}_0/\bar{r}_0^2$ will equal to 5. From FIG. 7, the ratio f of sheath radius to electrode radius will equal 4, providing an initial sheath radius $r_{S0} = 4$ centimeters. Choosing a pulse length $t = 30$ microseconds, the ultimate sheath radius at the end of the pulse will be 11.5 centimeters, requiring a cell spacing 2D equal to 23 centimeters on centers of the multiple targets. The fluence F per pulse will be $1.3 \times 10^{12}$ per square centimeter. To achieve a total fluence of $5 \times 10^{17}$ per square centimeter, $4 \times 10^5$ pulses are thus required. The time T between pulses dictated by cooling considerations will thus be equal to $T = e\phi_0 F/H_{avg} = (1.6\times 10^{-19}$ coulombs) $(10^5 V)$ $(1.3\times 10^{12} cm^{-2})/(5$ watts/cm$^2) = 4.2$ milliseconds, which is much greater than the pulse length t which is equal to 30 microseconds.

If it were assumed that the current is substantially constant during the pulse (not necessarily a practical assumption), the conduction current density for the foregoing example would be $(1.6\times 10^{-19}$ coulombs) $(1.3\times 10^{12}$ cm$^{-2})/(30$ microseconds) $= 0.007$ amperes/cm$^2$.

Assuming the targets are a matrix of 50 cylinders having a length equal to 5 centimeters and a radius of 1 centimeter, the peak conduction current would then be $50\times 2\pi(1$ cm)(5 cm)(0.007 A/cm$^2) = 11$ A.

Of course, it should be understood that the peak current at the beginning of the pulse is greater than this average current due to displacement current and transient sheath effects.

The average conduction current is $(11$ A$)\times(30$ microseconds)$/(4.2$ milliseconds$) = 80$ mA, and the average power is $100$ kV$\times 80$ mA $= 8$ kW.

The total implantation time for the foregoing example would thus be equal to: $(4\times 10^5$ pulses) (4.23 milliseconds) $= 1692$ seconds $= 28.2$ minutes.

The square array of 50 targets (actually, a 7 by 7 array or 49 targets) would occupy a square 160 centimeters on a side, or an area of 2.6 square meters.

From the foregoing example, it may be seen that the desired geometrical packinq between multiple targets or between a single target and the walls of the enclosure determines the pulse length, whereas the total implantation time is determined by the time T between pulses which is constrained by the ability to cool the target during implantation. Using the conditions of the above example, the relationship of the chosen pulse length to the required cell spacing and vacuum chamber area is illustrated below in Table 1.

TABLE 1

| Pulse Length (μ sec) | Cell Spacing 2D (cm) | Area of Vacuum Chamber Base for a 7 × 7 Array of Tools (m²) |
|---|---|---|
| 10 | 13 | 0.8 |
| 20 | 18 | 1.6 |
| 30 | 23 | 2.6 |
| 50 | 33 | 5.3 |
| 100 | 58 | 16.5 |

From the data above, it seen that the chamber area increases rapidly and nonlinearly as the pulse length increases, increasing roughly as the square of the pulse Again using the conditions from the foregoing example, the effect of changes in the plasma density, keeping other factors constant, is illustrated below in Table 2.

TABLE 2

| density (cm$^{-3}$) | $\lambda_D$ (cm) | $\bar{r}_o$ | $\bar{\phi}/\bar{r}_o^2$ | Initial Sheath Radius (cm) |
|---|---|---|---|---|
| 10$^9$ | 0.033 | 30 | 60.0 | 10.0 |
| 10$^{10}$ | 0.010 | 100 | 5.0 | 4.0 |
| 10$^{11}$ | 0.0033 | 300 | 0.6 | 2.0 |

| Sheath Radius at t = 30 sec (cm) | Fluence per pulse | Off-time T (msec) | Cell Spacing 2D (cm) | Area of a 7 × 7 Array of tools (m²) |
|---|---|---|---|---|
| 18.0 | 3.2 × 10$^{11}$ | 1.0 | 36 | 6.5 |
| 11.5 | 1.3 × 10$^{12}$ | 4.2 | 23 | 2.6 |
| 9.5 | 9.0 × 10$^{12}$ | 29.0 | 19 | 1.8 |

It is seen that with cylindrical targets there is an advantage to increasing the plasma density as much as possible. In addition to the more favorable size scaling noted above, higher plasma density will provide more uniform implantation if the target has less than perfect cylindrical symmetry.

Implantation in accordance with the invention may also be accomplished with planar targets. Assuming a relatively large planar target in which loading effects are not significant, it may be shown that the maximum pulse length is determined only by the dimension of the vacuum chamber in the direction normal to the target plane. The normalized planar sheath thickness may be calculated as:

$$\bar{d} = r_{S0}/\lambda_D = (2\bar{\phi}_0)^{1/8}$$

so that the initial sheath position is:

$$r_{S0} = (2\bar{\phi}_0)^{\frac{1}{2}}\lambda_D = (2\phi_0)^{\frac{1}{2}} \times 743 \ (T_e/n)^{1/8}$$

For $T_e = 2$ eV, and $\phi_0 = 100$ kV, this gives $r_{S0} = 3.3 \times 10^5 \times (n)^{-\frac{1}{2}}$.

Typical values for the various parameters as a function of the plasma density n are given in Table 3 below.

TABLE 3

| | | Final Sheath Thickness for Various Pulse Lengths | | | |
|---|---|---|---|---|---|
| n (cm$^{-3}$) | $r_{S0}$ (cm) | 10 μsec | 30 μsec | 50 μsec | 100 μsec |
| 10$^9$ | 10.5 | 13.0 | 18.0 | 23.0 | 35.5 |
| 10$^{10}$ | 3.3 | 5.8 | 10.8 | 15.8 | 28.3 |
| 10$^{11}$ | 1.1 | 3.6 | 8.6 | 13.6 | 26.1 |

The fluence per pulse is $F = nr_s$. Table 4 below illustrates the scaling of fluence with pulse length for a density n $= 10^{10}$ per cubic centimeter:

TABLE 4

| Pulse Length (μ sec) | Fluence per pulse (cm$^{-2}$) |
|---|---|
| 10 | 0.6 × 10$^{11}$ |
| 30 | 1.0 × 10$^{11}$ |
| 50 | 1.6 × 10$^{11}$ |
| 100 | 2.8 × 10$^{11}$ |

For a fixed pulse length of 30 microseconds, the variation of fluence with density is shown in Table 5 below:

TABLE 5

| Density (cm$^{-3}$) | Fluence per pulse (cm$^{-2}$) |
|---|---|
| 10$^9$ | 0.2 × 10$^{11}$ |
| 10$^{10}$ | 1.1 × 10$^{11}$ |
| 10$^{11}$ | 8.6 × 10$^{11}$ |

It is seen that the fluence per pulse is much lower for planar targets than for cylindrical targets because there is no geometric compression (i.e., the planar sheath area equals the planar target area). The heat transfer limitations thus allow a higher duty cycle for the implantation of planar targets. If a heat transfer limit of 5 watts/cm$^2$ is assumed, as well as a typical fluence per pulse of 10$^{11}$ per square centimeter, the time between pulses is 0.3 milliseconds, providing a duty cycle of 10% if the pulse length is 3.0 microseconds. It is also seen that for planar targets there is little advantage in increasing the plasma density.

It is understood that the present invention is not limited to the particular embodiments set forth herein as illustrative, but embraces all such modified forms thereof as come within the scope of the following claims.

What is claimed is:

1. A method of implanting ions from a plasma into a target object comprising the steps of:
   (a) positioning the target object in an enclosing chamber;
   (b) generating a plasma of ions which surrounds the target object;
   (c) then, independently from generating the plasma, applying a high negative voltage pulse to the target object to accelerate the ions in the plasma toward the target from the plasma surrounding the target at an ion energy sufficient to implant ions impacting the target object beneath the surface of and into the crystal lattice of the target object.

2. The method of claim 1 wherein the step of accelerating ions toward the target object is performed multiple times in a periodic manner composed of short pulses of ions driven toward the target.

3. The method of claim 1 wherein the ions are accelerated toward the target at an average energy of at least 20 keV.

4. The method of claim 1 wherein the plasma contains ionized gases selected from the group consisting of nitrogen, hydrogen, oxygen, and argon.

5. The method of claim 1 wherein the target object is a metal, the plasma is formed of ionized nitrogen, and the step of accelerating the ions toward the target object is performed to provide an average energy to the nitrogen ions of at least 40 keV.

6. The method of claim 1 wherein the target object is formed of silicon.

7. The method of claim 1 wherein the ions are accelerated to impact the target object at an energy sufficient to drive ions on an average at least several hundred Angstroms beneath the surface of the target object.

8. The method of claim 1 wherein the material forming the target object is selected from the group consisting of pure metals, metal alloys, semiconductors, ceramics, and organic polymers.

9. The method of claim 2 wherein the ions are accelerated toward the target in pulses of a duration of at least approximately 1 microsecond at a repetition rate of at least approximately 60 times per second.

10. A method of implanting ions in a target object comprising the steps of:
    (a) providing an enclosing chamber having walls of electrically conductive material;
    (b) suspending a target object within the chamber spaced away from the walls of the chamber;
    (c) evacuating the interior of the chamber to a very low base pressure;
    (d) forming a plasma of ions in the chamber around the target object;
    (e) independently of forming the plasma, applying a pulse of high voltage between the chamber walls and the target object at a voltage sufficient to implant ions from the plasma into the target object.

11. The method of claim 10 wherein the step of applying a pulse of voltage between the chamber walls and the target object is performed repetitively and periodically until a desired concentration of ions in the target object has been obtained.

12. The method of claim 10 wherein, in the step of applying a pulse of voltage, the voltage is at least 20 kilovolts.

13. The method of claim 10 wherein the material of the target object is selected from the group consisting of pure metals, alloys, semiconductors, ceramics and organic polymers.

14. The method of claim 10 wherein the plasma is formed from ions of gases selected from the group consisting of nitrogen, hydrogen, oxygen and argon.

15. The method of claim 10 wherein the step of applying a pulse of voltage is performed at a voltage level sufficient to drive ions beneath the surfaces of the target object at least an average of several hundred Angstroms.

16. The method of claim 10 wherein the step of forming a plasma of ions in the chamber includes the steps of introducing a neutral gas at a controlled rate into the chamber such that a desired low pressure is maintained in the chamber and applying ionizing radiation to the interior of the chamber to ionize the neutral gas in the chamber into a plasma.

17. The method of claim 16 wherein the step of applying ionizing radiation is performed by ejecting electrons from an electron source into the chamber in a diffuse beam to ionize the neutral atoms or molecules in the chamber.

18. The method of claim 10 wherein the plasma is formed of ionized nitrogen and the target object is selected from the group consisting of metals, metal alloys, semiconductors, ceramics, and organic polymers.

19. The method of claim 18 wherein the step of applying a pulse of voltage is performed at a voltage level of at least 20 kilovolts.

20. A method of implanting ions in a target object comprising the steps of:
    (a) providing an enclosing chamber having walls of electrically conductive material;
    (b) suspending a target object within the chamber spaced away from the walls of the chamber;
    (c) evacuating the interior of the chamber to a very low base pressure;
    (d) forming a plasma of ions in the chamber around the target object;
    (e) applying repetitive pulses of high voltage between the chamber walls and the target object independently of the forming of the plasma to draw ions in the plasma to the target object at a voltage sufficient to implant ions from the plasma into the target object, the width of the pulses being selected such that the plasma sheath surrounding the target object does not expand to contact the enclosure walls during the pulse.

21. The method of claim 20 wherein, in the steps of applying repetitive pulses of voltage, the voltage is at least 20 kilovolts.

22. The method of claim 20 wherein the step of forming a plasma of ions in the chamber includes the steps of introducing a neutral gas at a controlled rate into the chamber such that a desired low pressure is maintained in the chamber and applying ionizing radiation to the interior of the chamber to ionize the neutral gas in the chamber into a plasma.

23. The method of claim 22 wherein the step of applying ionizing radiation is performed by ejecting electrons from an electron source into the chamber in a diffuse beam to ionize the neutral atoms or molecules in the chamber.

24. The method of claim 20 wherein in the step of applying repetitive pulses of voltage, the time between pulses is selected such that thermal equilibrium of the target object is maintained.

25. A method of implanting ions in a target object comprising the steps of:
   (a) providing an enclosing chamber having walls of electrically conductive material;
   (b) suspending a plurality of target objects within the chamber spaced away from the walls of the chamber and from each other;
   (c) evacuating the interior of the chamber to a very low base pressure;
   (d) forming a plasma of ions in the chamber around the target objects;
   (e) applying repetitive pulses of high voltage between the chamber walls and the target objects independently of the forming of the plasma to draw ions in the plasma to the target object at a voltage sufficient to implant ions from the plasma into the target objects, the width of each pulse of high voltage selected such that the plasma sheath surrounding each target object does not expand during the pulse to contact the plasma sheath surrounding another target object or to contact the walls of the chamber.

26. The method of claim 25 wherein, in the step of applying repetitive pulses of voltage, the voltage is at least 20 kilovolts.

27. The method of claim 25 wherein the step of forming a plasma of ions in the chamber includes the steps of introducing a neutral gas at a controlled rate into the chamber such that a desired low pressure is maintained in the chamber and applying ionizing radiation to the interior of the chamber to ionize the neutral gas in the chamber into a plasma.

28. The method of claim 27 wherein the step of applying ionizing radiation is performed by ejecting electrons from an electron source into the chamber in a diffuse beam to ionize the neutral atoms or molecules in the chamber.

29. The method of claim 25 wherein in the step of applying repetitive pulses of high voltage, the time spacing between pulses is selected such that thermal equilibrium of the target objects is maintained.

30. An apparatus for implanting ions in a target object comprising:
   (a) electrically conductive enclosure walls defining an enclosing chamber surrounding a sealed space;
   (b) means for supporting a target object within the enclosing chamber at a position spaced away from and electrically isolated from the enclosure walls of the chamber and for providing an electrical connection between the target object so supported and the exterior of the chamber;
   (c) means for forming a plasma of ions of a selected material within the enclosing chamber around the target object;
   (d) means for evacuating the interior of the enclosing chamber to a desired low pressure level; and
   (e) means, independent of the means for forming a plasma, for applying a pulse of voltage between the enclosure walls and the target object sufficient to implant ions from the plasma into the target object.

31. The apparatus of claim 30 wherein the means for applying a pulse of voltage applies pulses repetitively and periodically at a peak voltage level of not less than 20 kilovolts.

32. The apparatus of claim 30 wherein the means for supporting the target object within the enclosing chamber includes a stage adapted to hold a target object and be in electrical contact therewith, and a conductive support arm extending from the conductive stage and through the conductive walls of the chamber, the conductive arm being sealed to and electrically insulated from the enclosure wall through which it extends.

33. The apparatus of claim 30 wherein the means for forming a plasma of ions includes means for supplying a selected plasma source neutral gas at a controlled rate into the interior of the enclosing chamber such that a desired low pressure level is maintained within the chamber and means for applying ionizing radiation to the neutral gas in the chamber to ionize the gas into a plasma.

34. The apparatus of claim 33 wherein the means for applying ionizing radiation to the neutral gas includes an electron beam source mounted to the chamber wall to inject a diffuse beam of electrons into the interior of the enclosing chamber wherein the electrons make contact with and ionize neutral atoms or molecules of the gas within the chamber.

35. The apparatus of claim 34 including magnets mounted on the walls of the enclosing chamber to provide a magnetic field extending into the chamber to deflect electrons ejected into the interior of the chamber away from the walls to thereby maximize the path length of the electrons within the chamber and the likelihood of collision between electrons and neutral atoms within the chamber.

36. The apparatus of claim 34 wherein the means for applying a high voltage pulse between the enclosure walls and the target object includes a high voltage pulse source connected to the means for supporting the target object within the chamber and means for grounding the conductive enclosure walls of the chamber.

37. The apparatus of claim 30 wherein the means for supporting a target object supports a plurality of target objects at positions in the enclosing chamber spaced away from the enclosure walls and from each other.

* * * * *